(12) United States Patent
Watanabe et al.

(10) Patent No.: US 6,432,198 B2
(45) Date of Patent: Aug. 13, 2002

(54) METHOD FOR GROWING A SEMICONDUCTOR CRYSTAL FROM A SEMICONDUCTOR MELT

(75) Inventors: Masahito Watanabe; Minoru Eguchi, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/775,177

(22) Filed: Feb. 1, 2001

Related U.S. Application Data

(62) Division of application No. 09/268,615, filed on Mar. 15, 1999, now Pat. No. 6,221,156.

(30) Foreign Application Priority Data

Mar. 16, 1998 (JP) .......................................... 10-065174

(51) Int. Cl.$^7$ .............................................. C30B 15/00
(52) U.S. Cl. ........................................ 117/29; 117/32
(58) Field of Search .............................. 117/13, 29, 32, 117/208, 917

(56) References Cited

U.S. PATENT DOCUMENTS

| 4,619,730 A | * 10/1986 | Suzuki et al. .......... 156/617 SP |
| 5,021,224 A | 6/1991 | Nakajima |

FOREIGN PATENT DOCUMENTS

| DE | 1 004 818 | 3/1957 | ............. C22F/1/30 |
| DE | 35 19 632 A1 | 1/1986 | ............ C30B/15/14 |
| JP | 02217389 A | 8/1990 | ............ C30B/15/22 |

* cited by examiner

Primary Examiner—Benjamin L. Utech
Assistant Examiner—Matthew A. Anderson
(74) Attorney, Agent, or Firm—Hayes Soloway P.C.

(57) ABSTRACT

In an apparatus for growing a semiconductor single crystal from semiconductor melt, a crucible retains the semiconductor melt. An electrode contacts with the semiconductor melt and applies current to the semiconductor melt. The electrode is formed of the same material as the semiconductor crystal.

4 Claims, 3 Drawing Sheets

METHOD FOR GROWING A SEMICONDUCTOR CRYSTAL FROM A SEMICONDUCTOR MELT

This application is a Divisional of 09/268,615 filed Mar. 15, 1999, now U.S. Pat. No. 6,221,156.

BACKGROUND OF THE INVENTION

This invention relates to an apparatus for growing a semiconductor crystal and a method of growing the same, and in particular, to a crystal growing technique for rotating semiconductor melt (or solution) by applying a magnetic field and current which cross each other in the semiconductor melt.

A semiconductor crystal wafer used as a substrate of a super highly integrated electronic device is generally grown by the use of the Czochralski method (hereinafter, abbreviated as the CZ method).

In the CZ method, the semiconductor crystal wafer is grown by pulling a semiconductor single crystal from a rotating semiconductor melt while rotating the semiconductor single crystal in an opposite direction to that of the semiconductor melt.

With such an arrangement, the semiconductor melt is retained in a crucible which is heated by a cylindrical heater which is arranged around the crucible. Using this arrangement, the crucible is rotated so as to ensure uniform temperature distribution in the semiconductor melt.

To this end, it is necessary that a rotating center of the crucible and a symmetrical axis of heater arrangement correspond to the pull axis of the semiconductor crystal in order to ensure uniform temperature distribution in the semiconductor melt symmetrical with the axis.

In general, the axis for holding the crucible is mechanically rotated in a conventional manner.

However, a large apparatus is required to rotate a crucible used for growing large size crystals. Consequently, the growth of large semiconductor crystals is difficult.

To solve such difficulty, an apparatus for growing a semiconductor crystal and a method of growing the same has been proposed in unpublished Japanese Patent Application No. Hei. 9-343261, which apparatus includes a device for applying a magnetic field to semiconductor melt during growth of a semiconductor crystal and another device for applying current perpendicular to the magnetic field of the semiconductor melt.

Further, an electrode which is immersed in the semiconductor melt and another electrode which supplies current to pull a semiconductor crystal are used in the above semiconductor crystal growing apparatus.

In this semiconductor crystal growing apparatus, even when a semiconductor crystal having a large diameter of 30 cm or more is grown, the size of the apparatus is minimized, and it is possible to accurately control rotation.

However, when electrode material is dissolved in the semiconductor melt and the electrode material contains material other than the semiconductor melt and the growing semiconductor crystal, the purity of the semiconductor melt and the growing crystal is degraded. This produces an adverse affect for the other impunity concentration distribution.

Moreover, when the electrode is immersed into the semiconductor melt, the rotation of the semiconductor melt is partially interrupted by the electrode. As a result, symmetry of the rotation is also degraded.

SUMMARY OF THE INVENTION

It is therefore an object of this invention to provide an apparatus for growing a semiconductor crystal and a method of growing the same in which no contaminated impurity is mixed from an electrode into semiconductor melt (or solution).

It is another object of this invention to provide an apparatus for growing a semiconductor crystal and a method of growing the same in which rotation symmetry of semiconductor melt is not degraded.

According to this invention, a crucible holds a semiconductor melt. Further, an electrode contacts the semiconductor melt and applies a current to the semiconductor melt. With such an arrangement, the electrode is formed of the same material as the semiconductor crystal.

In this case, a magnetic field is applied to the semiconductor melt in addition to the current. The magnetic field is substantially perpendicular to the current. Herein, the current is applied between the semiconductor melt and the semiconductor crystal.

Moreover, a predetermined impurity is doped into the semiconductor crystal from the semiconductor melt. Under this circumstance, the semiconductor crystal does not contain the other impurity except for the doped impurity.

In this case, the semiconductor crystal may be a silicon single crystal, and the electrode is formed by the silicon single crystal. Under this circumstance, a predetermined impurity and oxygen are doped into the silicon single crystal from the semiconductor melt. In this case, the silicon single crystal does not contain the other impurity except for the doped impurity and the oxygen.

Alternatively. the semiconductor crystal may be a GaAs single crystal. In this case, the electrode is formed of GaAs single crystal.

Further, the semiconductor crystal may be an InP single crystal. In this case, the electrode is formed of InP single crystal.

More specifically, when current is applied or supplied between the semiconductor melt and the semiconductor crystal during growth, the same material as the semiconductor crystal to be grown is used as the electrode.

Consequently, no impurity is mixed from the electrode into the semiconductor melt, and further, unnecessary impurity is not mixed into the growing semiconductor crystal.

Further, the electrode contacts with the semiconductor melt at a position above the main surface of the semiconductor melt. As a consequence, the rotation of the semiconductor melt is not disturbed by the electrode. As a result, the rotation of the semiconductor melt is not degraded.

Thereby, the symmetry of the axis of temperature distribution is enhanced, and concentration distribution of the dopant impurity trapped or doped in the semiconductor crystal becomes uniform in a radial direction.

Moreover, the concentration distribution of oxygen can be further equalized in the radial direction in the case of the silicon single crystal.

DESCRIPTION OF THE PREFERRED EMBODIMENT

Figure 1:
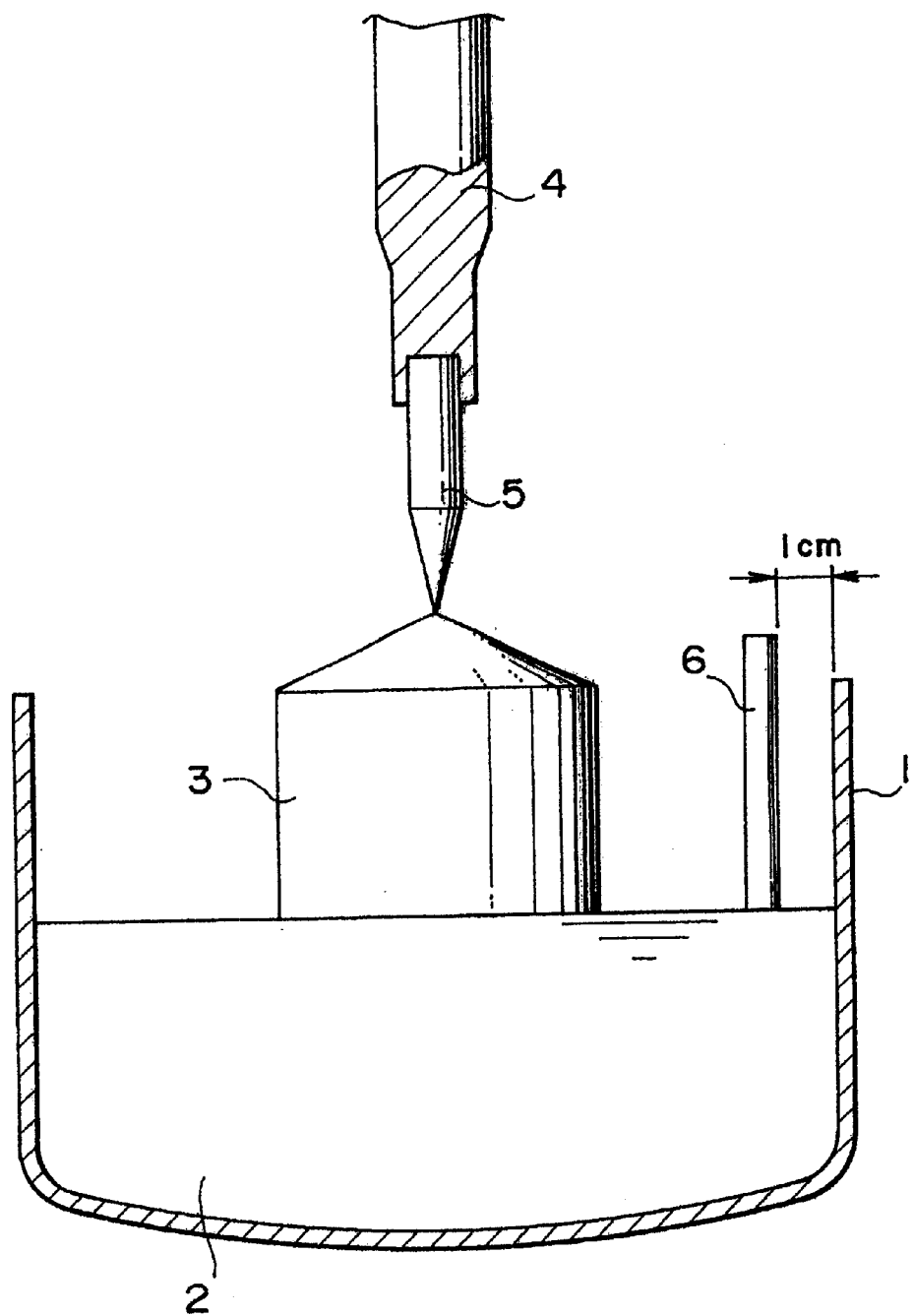
FIG. 1 is a cross sectional view illustrating an immersion position of an electrode when a semiconductor single crystal is grown by the use of the CZ method according to this invention.

Hereinafter, description will be made to an embodiment of this invention referring to drawings.

First, description will be made to a method for applying or supplying current between a growing semiconductor single crystal and a semiconductor melt (or solution) retained in a magnetic field with reference to FIG. 1.

Herein, it is to be noted that peripheral devices, such as, a magnetic field applying device and a heater are left out so as to emphasize main component portions.

A semiconductor single crystal 3 is pulled up from semiconductor melt 2 retained in a crucible 1 via a seed crystal 5. In this case, the seed crystal 5 is set at a tip portion of a pulling axis 4 formed by a material having electric conduction.

Although the seed crystal 5 is coupled to the pulling axis 4 like the case of the crystal growth of the general CZ method, contact area between the seed crystal 5 and the pulling axis 4 becomes large in order to maintain electric conduction.

With such a system, an electrode 6 for supplying current between the growing semiconductor single crystal 3 and the semiconductor melt 2 in the crucible 1 is formed of the same material as the semiconductor single crystal 3 to be grown.

Figure 2:
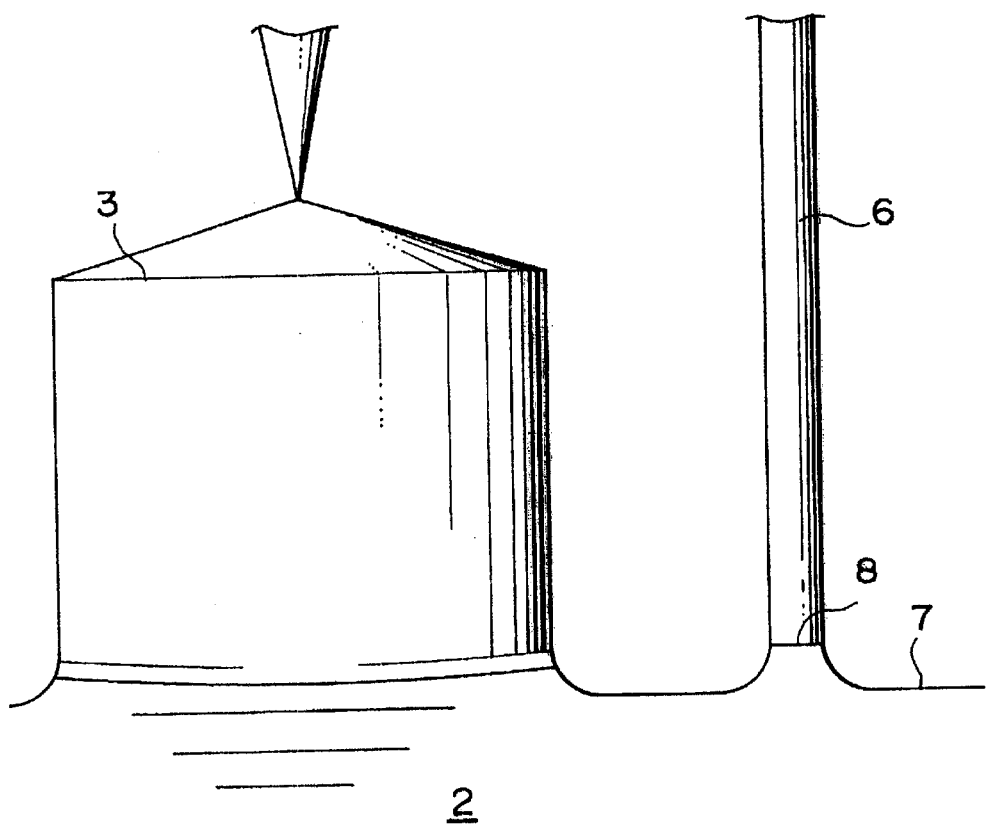
FIG. 2 is a cross sectional view illustrating an immersion position of an electrode and a semiconductor melt when a semiconductor single crystal is grown by the use of the CZ method according to this invention.

In this embodiment, the electrode 6 contacts the semiconductor melt 2 above the main surface 7 of the semiconductor melt 2, as illustrated in FIG. 2. Herein, it is to be noted that the reference numeral 8 in FIG. 2 denotes a contact surface between the electrode 6 and the semiconductor melt 2.

EXAMPLES

Subsequently, description will be made about examples of this invention.

In examples 1 through 4, a silicon solution of 0.3 Kg was manufactured in a quartz crucible having a diameter of 7.5 cm. In this case, an electrode rod was contacted with the surface of the silicon solution. Under these conditions, a silicon single crystal having a diameter of 3 cm was grown.

In this case, the contact position of the electrode was located inside apart from an internal wall of the crucible by 1 cm, as shown in FIG. 1. In this case, boron was added to the semiconductor melt so that the grown silicon single crystal became P-type and had resistivity of 10 Ωcm, 1 Ωcm, 0.1 Ωcm and 0.001 Ωcm, respectively.

Impurity elements in the grown crystal were analyzed by the use of the mass spectrometry thereby confirming whether or not the impurity was mixed in this sample to clarify effect of this invention.

Further, the concentration distribution of the dopant impurity in the semiconductor crystal was determined in the radial direction by the use of the spreading resistance method (namely, SR method).

Moreover, the concentration distribution of the oxygen in the semiconductor crystal was determined in the radial direction by the use of the scanning infrared absorption spectrometry (namely, FT-IR method).

During the growth of the crystal, the contact position between the electrode made by the silicon and the silicon solution was constantly observed from the side portion of the furnace by the use of the X-ray perspective.

Thereby, the relative position between the surface of the silicon solution and the silicon electrode was kept constant.

In examples 1 through 4, the contact position between the electrode and the solution was set to a position 3 mm above the main surface of the solution.

Table 1 reports a value of the applied magnetic field, a value of the current, other conditions for growing the crystal, and results of the grown crystal.

Herein, concentration distributions of the dopant and the oxygen in the radial direction were determined by the following equation:

$$[(\text{concentration at crystal center} - \text{concentration at crystal end})/\text{concentration at crystal center}] \times 100$$

TABLE 1

| | MAGNETIC FIELD STRENGTH (T) | CURRENT (A) | CRYSTAL ROTATION NUMBER (rpm) | RESISTIVITY (Ω cm) | INPURITY | DOPANT CONCENTRATION DISTRIBUTION (%) | OXYGEN CONCENTRATION DISTRIBUTION (%) |
|---|---|---|---|---|---|---|---|
| EXAMPLE 1 | 0.01–0.5 | 0.01–10 | 1–10 | 10 | NO DETECTION | 1.0 | 1.0 |
| EXAMPLE 2 | 0.01–0.5 | 0.01–10 | 1–10 | 1 | NO DETECTION | 1.0 | 1.0 |
| EXAMPLE 3 | 0.01–0.5 | 0.01–10 | 1–10 | 0.01 | NO DETECTION | 1.0 | 1.0 |
| EXAMPLE 4 | 0.01–0.5 | 0.01–10 | 1–10 | 0.001 | NO DETECTION | 1.0 | 1.0 |

In examples 5 through 8, the silicon solution of 300 Kg was held in a quartz crucible having a diameter of 70 cm. In this case, the silicon single crystals which had resistivity of 10 Ωcm, 1 Ωcm, 0.01 Ωcm and 0.001 Ωcm and the diameter of 30 cm were grown from the silicon solution.

In this case, the silicon single crystal was grown under the same condition that the silicon single crystal electrode of 0.4 cm diameter was grown.

Figure 3:
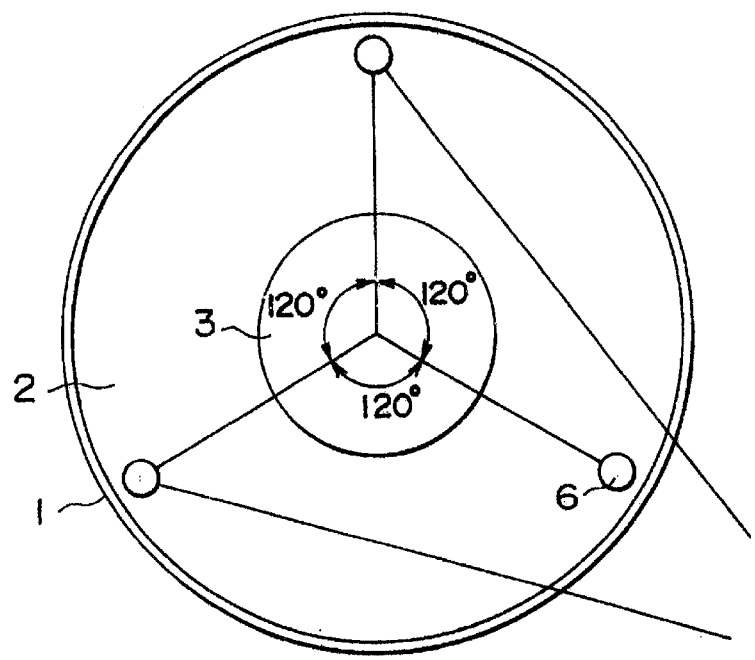
FIG. 3 is a plane view illustrating positions of a plurality of electrodes when a semiconductor single crystal is grown by the use of the CZ method according to an embodiment of this invention.
Figure 4:
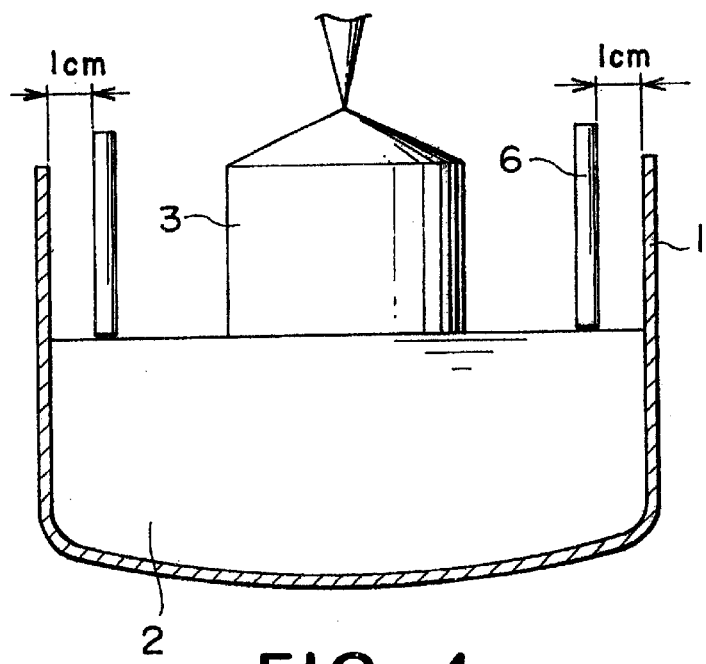
FIG. 4 is a cross sectional view illustrating immersion positions of a plurality of electrodes when a semiconductor single crystal is grown by the use of the CZ method according to an embodiment of this invention.

In these examples, the contact position between the electrode and the solution was set to a height of 3 mm above the main surface of the solution. The arrangement of the electrodes is illustrated in FIGS. 3 and 4.

Table 2 reports the value of the applied magnetic field, the value of the current, other conditions for growing the crystal, and results of the grown crystal.

It is thus seen from the above-mentioned examples that silicon single crystal, which no impurity except for dopant impurity and oxygen, can be grown by the method of this invention.

Further, non-uniformity of oxygen concentration distribution and dopant impurity concentration distribution in the silicon single crystal grown by the method of this invention in racial direction is equal to 1% or less. As a consequence, it is seen that the solution rotates conditions that the temperature distribution in the solution completely corresponds to the is of the semiconductor crystal.

Moreover, the silicon single crystals which had resistivity of 0.001 Ωcm and diameters of 3.0 cm, 30.0 and 40.0 cm

TABLE 2

| | MAGNETIC FIELD STRENGTH (T) | CURRENT (A) | CRYSTAL ROTATION NUMBER (rpm) | RESISTIVITY (Ω cm) | INPURITY | DOPANT CONCENTRATION DISTRIBUTION (%) | OXYGEN CONCENTRATION DISTRIBUTION (%) |
|---|---|---|---|---|---|---|---|
| EXAMPLE 5 | 0.01–0.5 | 0.01–10 | 1–10 | 10 | NO DETECTION | 0.5 | 0.5 |
| EXAMPLE 6 | 0.01–0.5 | 0.01–10 | 1–10 | 1 | NO DETECTION | 0.5 | 0.5 |
| EXAMPLE 7 | 0.01–0.5 | 0.01–10 | 1–10 | 0.01 | NO DETECTION | 0.5 | 0.5 |
| EXAMPLE 8 | 0.01–0.5 | 0.01–10 | 1–10 | 0.001 | NO DETECTION | 0.5 | 0.5 |

In examples 9 through 12, silicon single crystals which had resistivity of 10 Ωcm, 1 Ωcm, 0.01 Ωcm and 0.001 Ω and a diameter of 40 cm were grown using a quartz crucible having the diameter of 100 cm.

In this case, the crystal growth was carried out under conditions where three silicon electrodes, each of which had the diameter of 0.4 mm, were contacted with the surface of the silicon solution in the same manner as the example illustrated in FIG. 3.

In these examples. the contact position between the electrode and the solution was set to a height of 3 mm above the main surface of the solution.

Table 3 reports the value of the applied magnetic field, the value of the current, other conditions for growing the crystal, and results of the grown crystal.

were grown without using a silicon electrode in comparison with the examples 1 through 12.

Table 4 represents material used as the electrode, analyzed result of impurity in the grown crystal, concentration distribution of the dopant impurity. and concentration distribution of the oxygen.

Herein, it is to be noted that the conditions of the crystal growth, which are not described in Table 4, are similar to the examples 1 through 12 including the arrangement of the electrodes.

In this case, the material of the electrode has different composition from the semiconductor single crystal to be grown in the comparative examples. Namely, the electrode is formed of a different material.

Consequently, it is difficult to keep the contact position above the main surface of the solution. Therefore, the

TABLE 3

| | MAGNETIC FIELD STRENGTH (T) | CURRENT (A) | CRYSTAL ROTATION NUMBER (rpm) | RESISTIVITY (Ω cm) | INPURITY | DOPANT CONCENTRATION DISTRIBUTION (%) | OXYGEN CONCENTRATION DISTRIBUTION (%) |
|---|---|---|---|---|---|---|---|
| EXAMPLE 9 | 0.01–0.5 | 0.01–10 | 1–10 | 10 | NO DETECTION | 0.5 | 0.5 |
| EXAMPLE 10 | 0.01–0.5 | 0.01–10 | 1–10 | 1 | NO DETECTION | 0.5 | 0.5 |
| EXAMPLE 11 | 0.01–0.5 | 0.01–10 | 1–10 | 0.01 | NO DETECTION | 0.5 | 0.5 |
| EXAMPLE 12 | 0.01–0.5 | 0.01–10 | 1–10 | 0.001 | NO DETECTION | 0.5 | 0.5 | electrode contacted with the semiconductor melt at a position below the main surface of the solution with 3 mm to 5 mm.

cm using an InP single crystal having the same composition as the InP single crystal to be grown as the electrode material in the example 14.

TABLE 4

|  | CRYSTAL DIAMETER (cm) | CRUCIBLE DIAMETER (cm) | ELECTRODE MATERIAL | INPURITY | DOPANT CONCENTRATION DISTRIBUTION (%) | OXYGEN CONCENTRATION DISTRIBUTION (%) |
| --- | --- | --- | --- | --- | --- | --- |
| COMPARATIVE EXAMPLE 1 | 3.0 | 7.5 | CARBON | CARBON | 5.0 | 5.0 |
| COMPARATIVE EXAMPLE 2 | 3.0 | 7.5 | TUNGSTEN | TUNGSTEN | 5.0 | 5.0 |
| COMPARATIVE EXAMPLE 3 | 30.0 | 75.0 | CARBON | CARBON | 10.0 | 5.0 |
| COMPARATIVE EXAMPLE 4 | 30.0 | 75.0 | TUNGSTEN | TUNGSTEN | 10.0 | 10.0 |
| COMPARATIVE EXAMPLE 5 | 40.0 | 100.0 | CARBON | CARBON | 10.0 | 10.0 |
| COMPARATIVE EXAMPLE 6 | 40.0 | 100.0 | TUNGSTEN | TUNGSTEN | 10.0 | 10.0 |

It is thus seen that from these comparison results that impurities other than the dopant impurity and oxygen are mixed into the grown silicon single crystal when a material different from that of the semiconductor single crystal is used as the electrode material.

Further, when the electrode is placed at a position below the main surface of the solution, rotation of the solution is disturbed and symmetry of temperature distribution is also degraded.

As a result, it is confirmed that non-uniform property of oxygen concentration distribution and dopant impurity concentration distribution in the crystal in the radial direction is equal to 1% or more. Therefore, it is difficult to equalize the concentration distributions of the oxygen and the dopant impurity.

Subsequently, it is confirmed that this invention can be applied for the growth of the semiconductor single crystal other than silicon. Specifically, a GaAs single crystal having a diameter of 15 cm was grown from a p-BN (Pyrolytic-Boron Nitride) crucible having a diameter of 30 cm with the same electrode arrangement as the example 5, as the example 13.

In this case, the GaAs single crystal having the same composition as the GaAs single crystal to be grown was used as the electrode. In this case, the silicon was added with the desired quantity as the dopant so that the resistivity became 10 Ωcm.

Moreover, an InP single crystal having a diameter of 10 cm was grown from a p-BN crucible having a diameter of 20

In this case, antimony was added at the desired quantity as the dopant so that the resistivity became 10 Ωcm.

Table 5 represents conditions for growing the crystals of the examples 13 and 15, and the results of the grown crystals.

TABLE 5

|  | KIND OF CRYSTAL | CRYSTAL/ CRUCIBLE DIAMETER (cm) | ELECTRODE MATERIAL | INPURITY EXCEPT FOR DOPANT | DOPANT CONCENTRATION DISTRIBUTION (%) |
| --- | --- | --- | --- | --- | --- |
| EXAMPLE 13 | GaAs | 15.0/30.0 | GaAs SINGLE CRYSTAL | NO DETECTION | 0.5 |
| EXAMPLE 14 | InP | 15.0/30.0 | InP SINGLE CRYSTAL | NO DETECTION | 0.5 |

It is thus seen that a semiconductor single crystal containing no impurity except for the dopant impurity can be grown according to this invention when the semiconductor crystal other than silicon is grown.

Further, it is confirmed that uniform semiconductor crystal having dopant concentration distribution of 1% or less in the radial direction can be grown.

It is to be noted that this invention is not limited to the above-mentioned examples with respect to the arrangement and structure of the electrode. This invention is applicable for all devices and all methods in which the material having the same composition as the semiconductor crystal to be grown is used as the electrode.

Moreover, this invention is effective for the growth of crystal material other than semiconductor material.

What is claimed is:

1. A method of growing a semiconductor single crystal from semiconductor melt having a main surface, comprising the steps of:

retaining said semiconductor melt in a crucible;

contacting an electrode with said semiconductor melt at a position above the main surface of the melt;

applying at least current to said melt via said electrode; and pulling said semiconductor crystal from said melt via a seed crystal while applying current to said melt and rotating said melt;

wherein said electrode is formed of the same material as said semiconductor crystal, and said electrode is maintained in a fixed spacing above the main surface of the melt so as to not disturb the surface of said melt as it is rotated.

2. A method as claimed in claim 1, wherein:

a magnetic field is applied to said semiconductor melt in addition to the current.

3. A method as claimed in claim 1, wherein:

the magnetic field is substantially perpendicular to the current.

4. A method as claimed in claim 1, wherein:

the current is applied between said melt and said semiconductor crystal.

* * * * *